US012677377B2

(12) United States Patent
Mayfield et al.

(10) Patent No.: US 12,677,377 B2
(45) Date of Patent: Jul. 7, 2026

(54) METHODS FOR PROMOTING SELECTIVE COPPER FOIL ADHESION IN A PRINTED CIRCUIT BOARD

(71) Applicant: Rockwell Collins, Inc., Cedar Rapids, IA (US)

(72) Inventors: James B. Mayfield, Cedar Rapids, IA (US); John A. Bauer, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 257 days.

(21) Appl. No.: 18/386,707

(22) Filed: Nov. 3, 2023

(65) Prior Publication Data
US 2025/0151205 A1 May 8, 2025

(51) Int. Cl.
*H05K 3/30* (2026.01)
*H05K 1/02* (2006.01)
*H05K 3/02* (2006.01)
*H05K 3/303* (2026.01)

(52) U.S. Cl.
CPC ........... *H05K 3/305* (2013.01); *H05K 1/0266* (2013.01); *H05K 3/022* (2013.01); *H05K 2201/10098* (2013.01); *H05K 2203/0323* (2013.01)

(58) Field of Classification Search
CPC .................. H05K 3/305; H05K 3/022; H05K 2201/10098; H05K 2203/0323; H05K 1/0266; H05K 1/0225
See application file for complete search history.

(56) References Cited

U.S. PATENT DOCUMENTS

| | | | |
|---|---|---|---|
| 7,112,271 B2 | 9/2006 | Jo et al. | |
| 11,053,602 B2 | 7/2021 | Sung et al. | |
| 2004/0108211 A1 | 6/2004 | Chiu et al. | |
| 2004/0118812 A1* | 6/2004 | Watkins ................... | C23F 1/18 |
| | | | 216/83 |
| 2013/0033827 A1 | 2/2013 | Das et al. | |
| 2013/0108118 A1 | 5/2013 | Hinaga et al. | |
| 2015/0131246 A1* | 5/2015 | Moul ................... | H05K 1/0298 |
| | | | 174/251 |
| 2017/0079133 A1 | 3/2017 | Carlson et al. | |

(Continued)

FOREIGN PATENT DOCUMENTS

| | | |
|---|---|---|
| CN | 112118666 A | 12/2020 |
| EP | 0637902 B1 | 3/1999 |

OTHER PUBLICATIONS

European Patent Office, Extended European Search Report received in EP Application No. 24205376.7, Mar. 25, 2025, 9 pages.

*Primary Examiner* — Jeremy C Norris
(74) *Attorney, Agent, or Firm* — Suiter Swantz IP

(57) ABSTRACT
A method of fabricating a printed circuit board (PCB) including selectively etching copper foil at mapped areas corresponding to predefined radio-frequency (RF) signal performance of a device, for instance an active electrically scanned array (AESA). In embodiments, first and second RF performance areas of a device are mapped, the copper foil is etched at surface portions corresponding to the first RF performance areas to increase surface roughness, and the copper foil is bonded to a substate such that etched portions are aligned with the first RF performance areas of the PCB. In embodiments, the signal performance in the first RF performance areas is greater than the signal performance in the second RF performance areas.

15 Claims, 4 Drawing Sheets

100

102 Provide a PCB substrate
104 Provide a copper foil
106 Map substrate areas corresponding to first and second RF performance areas of the PCB
108 Map copper foil areas corresponding to the first and second RF performance areas of the PCB
110 Etching the surface of the copper foil to increase roughness in the first RF performance areas
112 Aligning the etched copper foil with the substrate
114 Bonding the etched copper foil to the substrate

200

202 Provide a copper foil
204 Provide a PCB configuration include first and second RF performance areas
206 Map copper foil with areas corresponding to first and second RF performance areas of the PCB
208 Etching the surface of the copper foil to increase roughness in the first RF performance areas

(56)  References Cited

U.S. PATENT DOCUMENTS

| 2018/0332720 | A1 | 11/2018 | Harkness, Jr. et al. |
| 2019/0376198 | A1 | 12/2019 | Dow et al. |
| 2022/0336342 | A1 | 10/2022 | Zhou et al. |
| 2024/0130036 | A1 * | 4/2024 | Bai ...................... H05K 1/0224 |

* cited by examiner

200

| 202 | Provide a copper foil |

204 — Provide a PCB configuration include first and second RF performance areas

206 — Map copper foil with areas corresponding to first and second RF performance areas of the PCB 208 — Etching the surface of the copper foil to increase roughness in the first RF performance areas

400

METHODS FOR PROMOTING SELECTIVE COPPER FOIL ADHESION IN A PRINTED CIRCUIT BOARD

TECHNICAL FIELD AND BACKGROUND

The present disclosure relates generally to methods for fabricating a printed circuit board (PCB), and more particularly, to methods for promoting selective copper foil adhesion in a PCB to facilitate the ability the rework the PCB assembly and lower assembly costs.

Printed circuit boards (PCBs) such as radio-frequency (RF) and other highspeed PCBs operate at very high frequencies. Such PCBs require copper conductors to have low surface roughness to limit the attenuation of a signal. While the use of lower profile copper foil is commonplace in the high-speed and RF PCB market for core laminate material, the use of lower profile copper foils on the internal/external plated layers is limited, as it results in lower peel strength adhesion to the substrate surface thereby limiting the type of rework and number of times that rework can be performed. It would therefore be desirable to provide a PCB with improved copper foil adhesion in select areas to both limit attenuation and allow rework.

BRIEF SUMMARY

In an aspect, embodiments of the inventive concepts disclosed herein are directed to a method of manufacturing a printed circuit board (PCB). In embodiments, the method includes providing a substrate, and providing a copper foil having a surface configured to be bonded to the substrate. The method further includes mapping, on the substrate, at least one first RF performance area of the PCB, and at least one second RF performance area of the PCB different from the at least one first RF performance area of the PCB. The method further includes mapping, on the surface of the copper foil, the at least one first RF performance area of the PCB and the at least one second RF performance area of the PCB. The method further includes etching, by an etching process, the surface of the copper foil corresponding to the mapped at least one first RF performance area of the PCB. The method further includes positioning the copper foil relative to the substrate such that the etched surface is aligned with the mapped at least one first RF performance area of the substrate, and bonding the surface of the copper foil to the substrate.

In some embodiments, the at least one second RF performance area of the PCB includes a plurality of separate areas, and the first RF performance area of the PCB includes a continuous area positioned in surrounding relation to the plurality of separate areas.

In some embodiments, the at least one second RF performance area of the PCB includes a plurality of separate areas, the first RF performance area of the PCB includes a plurality of separate areas, and at least one of the first RF performance areas surrounds at least one of the second RF performance areas.

In some embodiments, signal performance in the at least one second RF performance area of the PCB is greater than signal performance in the at least one first RF performance area of the PCB.

In some embodiments, the etching process includes at least one of an etchant and an oxide treatment process.

In some embodiments, the etching process includes laser texturing.

In some embodiments, after subjecting the surface of the copper foil to the etching process, the etched surface corresponding to the first RF performance has a greater surface roughness than the surface of the copper foil corresponding to the second RF performance.

In some embodiments, the method further includes, prior to etching the surface of the copper foil by the etching process, releasably bonding an opposing surface of the copper foil to a copper carrier using a release layer.

In some embodiments, the surface of the copper foil is adhesively bonded to the substrate.

In another aspect, embodiments of the inventive concepts disclosed herein are directed to a method for selectively etching a surface of a copper foil configured to be bonded to a substrate of a printed circuit board (PCB). In embodiments, the method includes providing a copper foil having a surface, providing a configuration for a PCB having at least one first area corresponding to a first radio-frequency (RF) performance, and at least one second area corresponding to a second RF performance different from the first RF performance, mapping on the surface of the copper foil the at least one area corresponding to the first RF performance, and etching by an etching process the mapped surface of the copper foil corresponding to the first RF performance.

In some embodiments, the surface of the copper foil corresponding to the at least one second RF performance is not etched by the etching process.

In some embodiments, after the etching process is complete the surface roughness of the surface of the copper foil is greater in the at least one area corresponding to the first RF performance than in the at least one area corresponding to the second RF performance.

In some embodiments, signal performance of the second RF performance is greater than signal performance of the first RF performance.

In some embodiments, the at least one area corresponding to the first RF performance substantially surrounds the at least one area corresponding to the second RF performance.

In a further aspect, embodiments of the inventive concepts disclosed herein are directed to a printed circuit board (PCB), for instance for use in an active electronically scanned array (AESA), including a substrate, a copper foil bonded to the substrate, first predefined areas of the PCB corresponding to a first radio-frequency (RF) performance, and second predefined areas of the PCB corresponding to a second RF performance different from the first RF performance. In embodiments, the copper foil has a greater surface roughness at areas of the copper foil aligned with the first predefined areas that at areas of the copper foil aligned with the second predefined areas, thereby providing greater adhesion of the copper foil at the first predefined areas than at the second predefined areas.

This summary is provided solely as an introduction to subject matter that is fully described in the following detailed description and drawing figures. This summary should not be considered to describe essential features nor be used to determine the scope of the claims. Moreover, it is to be understood that both the foregoing summary and the following detailed description are explanatory only and are not necessarily restrictive of the subject matter claimed.

BRIEF DESCRIPTION OF THE DRAWINGS

Implementations of the inventive concepts disclosed herein may be better understood when consideration is given to the following detailed description thereof. Such description refers to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
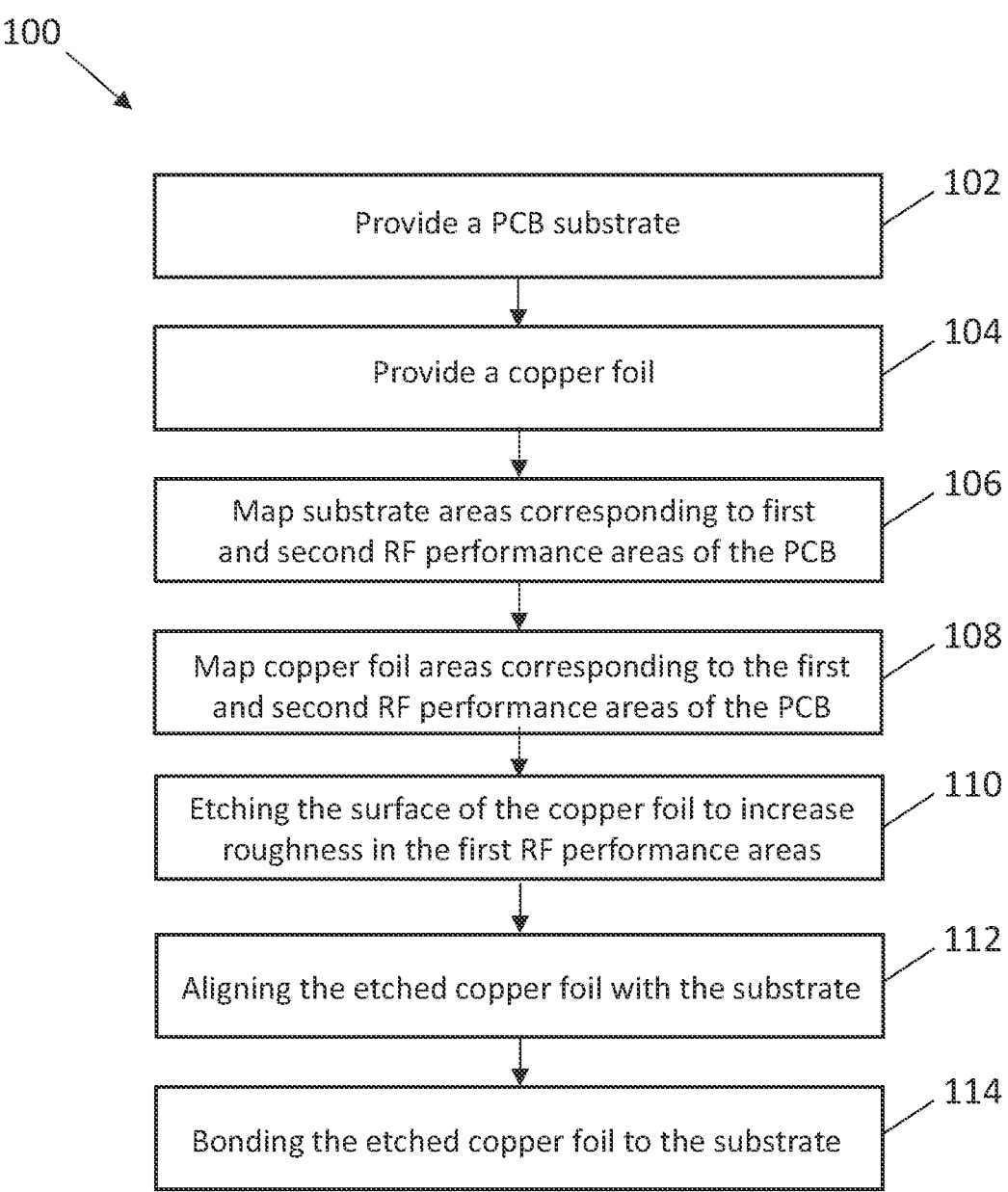
FIG. 1 is a flow diagram illustrating an example implementation of a method of manufacturing a PCB.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein, a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to methods for promoting copper foil adhesion in PCBs such as those used in AESAs. Considering surface roughness affects the performance of a PCB, and particularly the signal integrity of RF devices, the methods according to the present disclosure selectively surface roughen predefined areas of the copper foil corresponding to the low speed and surface mount device pads of the PCB, without surface roughening predefined areas of the PCB copper foil corresponding to high frequency RF signal performance. Such selective surface roughening promotes copper foil adhesion where the PCB is most likely to be reworked, and strengthens the bond of the copper foil at the location of the surface mount device pads, thereby increasing the robustness of the PCB which is critical for cost saving in AESAs likely subject to rework do to their large size and high number of components.

FIG. 1 is a flow diagram illustrating a method 100 for manufacturing a PCB. In general, operations of disclosed processes (e.g., method 100) may be performed in an arbitrary order, unless otherwise provided in the claims.

At step 102, the method includes providing a substrate, for instance a laminate core or a prepreg comprising fiberglass impregnated with a curable resin. At step 104, the method includes providing a copper foil. In embodiments, the copper foil may be a 'thin' copper foil having a thickness up to about 12 microns, or an 'ultrathin' copper foil having a thickness up to about 9 microns. In embodiments, the thickness of the copper foil may be greater than 12 microns. In some embodiments, considering the challenges of working with 'thin' and 'ultrathin' films, the copper foil may be releasably attached to a carrier, such as a comparatively thick copper foil attached using a release layer wherein the carrier copper foil is not included in the produced PCB but functions to provide rigidity during the etching and bonding steps discussed further below.

At step 106, in possession of a predefined PCB layout, the method includes mapping at least one area of the substrate corresponding to a first RF performance of the PCB, and mapping at least one area of the substrate corresponding to second RF performance of the PCB different from the first RF performance. In embodiments, mapping may be performed by computer implemented software programs configured to design a floorplan to produce a manufacturable layout. In embodiments, each of the first and second mapped areas may include a continuous are or separate areas. In embodiments, the at least one first RF performance area may correspond to 'low' speed and surface mount device pads where RF signal integrity is less critical, and the at least one second RF performance area may correspond to comparatively 'high' speed areas where signal integrity is critical. In embodiments, the at least one first RF performance area may correspond to zero or substantially zero RF performance. In embodiments, the substrate may include multiple separate first RF performance areas and multiple separate second RF performance areas, wherein first RF performance areas are positioned adjacent to second RF performance areas.

In some embodiments, it may be desirable to configure the PCB such that each second RF performance area is substantially surrounded by a first RF performance area to border each second RF performance area with a comparatively stronger bond due to the increased surface roughness provided by the border. In embodiments, RF performance may vary between each separate area within each of the first and second RF performance areas. In some embodiments, exceeding an RF threshold performance determines which areas are subjected to surface roughening (e.g., where signal integrity is less critical).

At step 108, the method continues with mapping at least one area of the copper foil corresponding to the first RF performance, and at least one area corresponding to the second RF performance. In some embodiments, the at least one first area may be mapped on the surface and the areas outside of the mapped areas inherently correspond to the second RF performance. In embodiments, depending on the configuration of the PCB and components thereof, the mapped first and second RF performance areas of the copper foil may substantially correspond in size and shape to the mapped first and second RF performance areas of the substrate, or may be oversized, undersized, and combinations thereof depending on the particular area.

At step 110, the method continues with etching, by an etching process, the mapped areas of the copper foil corresponding to the first RF performance of the PCB. In embodiments, the etching may be performed by a conventional selective bond enhancement process in which a photo-imageable resist is applied to both sides of the copper foil and then imaged and exposed to an etchant or oxide treatment process which roughens the exposed area. The resist is then stripped and cut out for layup. With this etching process the copper foil may be processed roll-to-roll. In other embodiments, a $CO_2$ laser may be used to texture the surface of the copper foil, and the pattern may vary depending on tooth and contact area considerations.

After the etching is complete, the first RF performance areas of the copper foil subjected to the etching process have a rougher surface as compared to the second RF performance areas not subjected to the etching process. In embodiments, the surface roughness or texture of the etched areas is different from the surface roughness or texture of the areas that were not etched. In some embodiments, the surface roughness of the second RF performance areas is not affected during the method 100. As discussed above, surface roughness contributes to signal loss but increases surface area for bonding. Thus, the configuration of the PCB can be optimized to increase bonding in strategic locations to increase the robustness of the PCB.

At step 112, the etched copper foil is positioned relative to the substrate such that the mapped first and second RF performance areas of the copper foil are aligned with the mapped first and second RF performance areas of the substrate. At step 114, the copper foil is bonded, with the etched surface facing the substrate, to the substrate. In embodiments, the aligned copper foil and substrate are laminated to form the PCB or a portion thereof, wherein additional copper foil adhesions may be performed according to the method 100 to produce a product. Conventional laminations and other methods may be used to bond the copper foil to the substrate.

Figure 2:
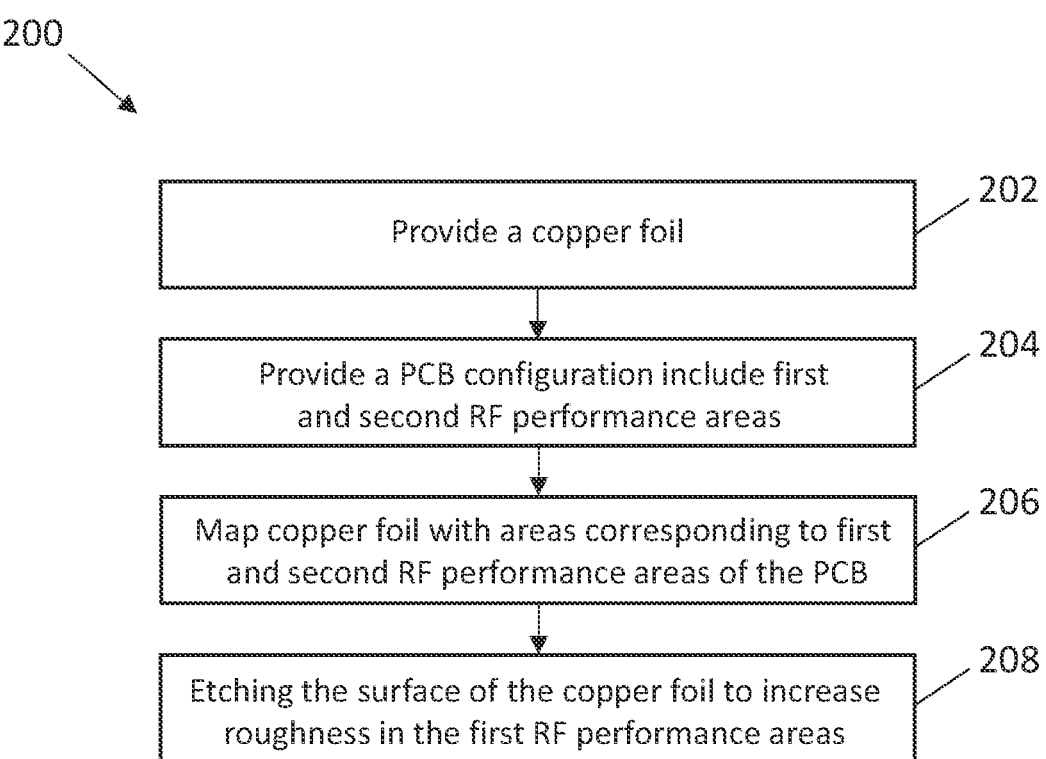
FIG. 2 is a flow diagram illustrating an example implementation of a method for selectively etching a surface of a copper foil configured to be bonded to a substrate of a PCB.

FIG. 2 is a flow diagram illustrating a method 200 for selectively etching a surface of a copper foil configured to be bonded to a substrate of a PCB. In general, operations of disclosed processes (e.g., method 200) may be performed in an arbitrary order, unless otherwise provided in the claims.

At step 202, the method includes providing a copper foil, such as a copper foil having a thickness no more than 12 microns (e.g., a 'thin' foil), or a copper foil having a thickness no more than 9 microns (e.g., an 'ultrathin' foil). In some embodiments, considering the challenges of working with 'thin' and 'ultrathin' films, the copper foil may be releasably attached to a carrier, such as a comparatively thick copper foil attached using a release layer wherein the carrier copper foil is not included in the produced PCB but functions to provide rigidity during the etching and bonding steps discussed further below.

At step 204, the method includes providing a configuration for a PCB having areas corresponding to a first radio-frequency (RF) performance, and areas corresponding to a second RF performance. In embodiments, the first RF performance areas may correspond to 'low' speed and surface mount device pads where RF signal integrity is less critical, and the second RF performance areas may correspond to comparatively 'high' speed areas where signal integrity is critical. In embodiments, the configuration may include multiple separate first RF performance areas and multiple separate second RF performance areas, wherein first RF performance areas are positioned adjacent to second RF performance areas. In some embodiments, it may be desirable to configure the PCB such that each second RF performance area is substantially surrounded by first RF performance areas to border each second RF performance area for adhesion strength as discussed above.

At step 206, the method continues with mapping areas of the copper foil corresponding to the first RF performance areas of the PCB, and in some embodiments also mapping the second RF performance areas of the PCB. In embodiments, depending on the configuration of the PCB and components thereof, the mapped first and second RF performance areas of the copper foil may substantially correspond in size and shape to the mapped first and second RF performance areas of the substrate, may be oversized, may be undersized, and combinations thereof depending on the area.

At step 208, the method continues with etching, by an etching process, the mapped areas of the copper foil corresponding to the first RF performance of the PCB. In embodiments, consistent with the method 100, the etching may be performed by a conventional selective bond enhancement process in which a photo-imageable resist is applied to both sides of the copper foil and then imaged and exposed to an etchant or oxide treatment process which roughens the exposed area. The resist is then stripped and cut out for layup. With this etching process the copper foil may be processed roll-to-roll. In other embodiments, a $CO_2$ laser may be used to texture the surface of the copper foil, and the pattern may vary depending on tooth and contact area considerations.

After the etching is complete, the first RF performance areas of the copper foil subjected to the etching process have a rougher surface as compared to the second RF performance areas not subjected to the etching process. In some embodiments, the surface roughness or texture of the etched areas is different from the surface roughness or texture of the areas that were not etched. In some embodiments, the surface roughness of the second RF performance areas is not affected during the method 200.

Figure 3:
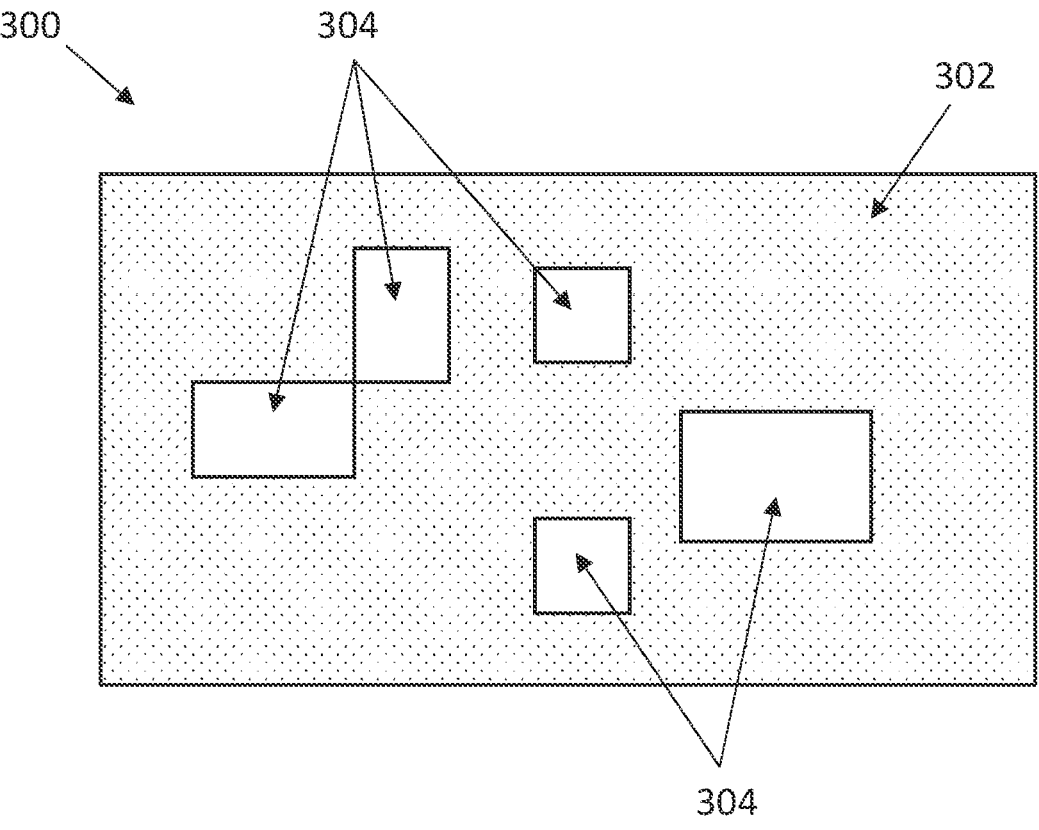
FIG. 3 is a schematic illustration of a mapped and etched copper foil, in accordance with example embodiments of this disclosure.

FIG. 3 illustrates schematically a mapped and etched copper foil 300, in accordance with example embodiments of this disclosure. The copper foil includes at least one first area 302 corresponding to the first RF performance of the PCB, and at least one second area 304 corresponding to the second RF performance of the PCB, as discussed above. In embodiments, the first RF performances area 302 may be one continuous area positioned in surrounding relation to a plurality of separate second RF performance areas. In some embodiments, two second RF performance areas may touch. In the case of an AESA, for example, features and components located in the second RF performance areas may include, but are not limited to, RF transmission lines, high-speed digital transmission lines, and return current paths (e.g., ground planes) for transmission lines, whereas features and components located in the first RF performance areas may include, but are not limited to, component solder pads, test points, and low-speed traces and filter traces.

Figure 4:
FIG. 4 is a schematic illustration of a laminated PCB including an etched copper foil, in accordance with example embodiments of this disclosure.
Figure 4:
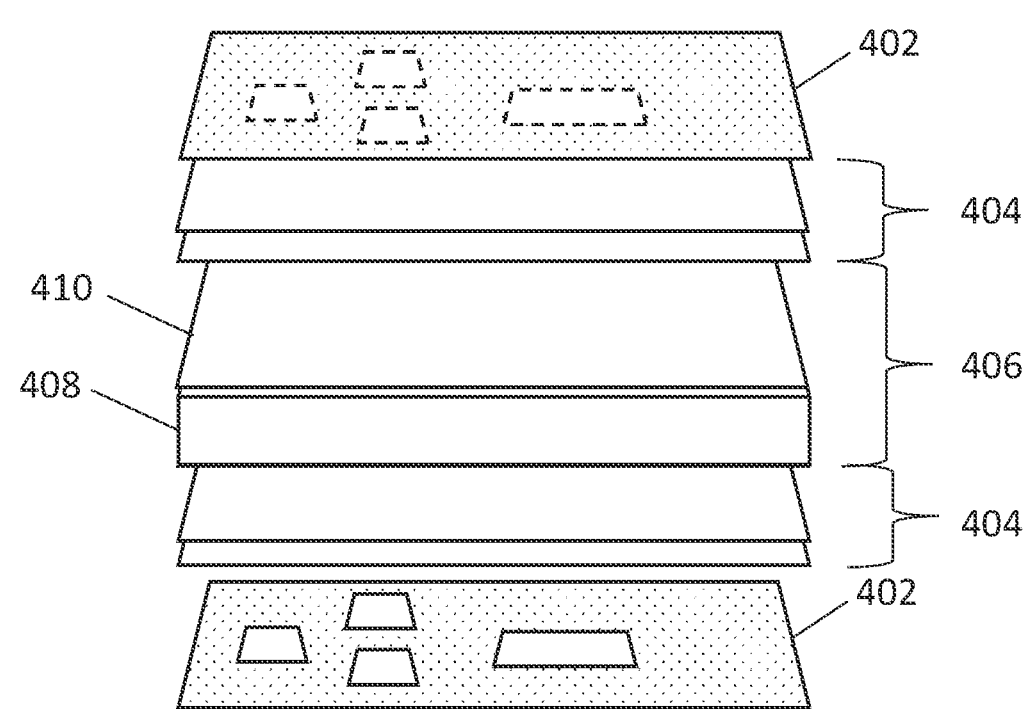

FIG. 4 illustrates schematically a lamination stack for a PCB including surface copper foils 402 including selectively etched first RF performance areas for bonding to opposing prepeg subassemblies 404, each including one or more layers, bonded to a laminated core subassembly 406. In embodiments, the core subassembly 406 includes a core substrate 408 having copper foil conductors 410 bonded to opposing faces thereof, wherein the copper foil conductors 410 may or may not be selectively etched according to the methods disclosed herein. In embodiments, the outer layers may be made with cores.

From the above description, it is clear that the inventive concepts disclosed herein are well adapted to achieve the objectives and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A method of manufacturing a printed circuit board (PCB), the method comprising:
    providing a substrate;
    providing a copper foil having a surface configured to be bonded to the substrate;
    mapping, on the substrate, at least one first radio-frequency (RF) performance area of the PCB, and at least one second RF performance area of the PCB different from the at least one first RF performance area of the PCB;
    mapping, on the surface of the copper foil, the at least one first RF performance area of the PCB and the at least one second RF performance area of the PCB;
    etching, by an etching process, the surface of the copper foil corresponding to the mapped at least one first RF performance area of the PCB, wherein, after subjecting the surface of the copper foil to the etching process, the etched surface corresponding to the first RF performance area has a greater surface roughness than the surface of the copper foil corresponding to the second RF performance area;
    positioning the copper foil relative to the substrate such that the etched surface is aligned with the mapped at least one first RF performance area of the substrate; and
    bonding the surface of the copper foil to the substrate.

2. The method according to claim 1, wherein:
    the at least one second RF performance area of the PCB comprises a plurality of separate areas; and

8 the first RF performance area of the PCB comprises a continuous area positioned in surrounding relation to the plurality of separate areas.

3. The method according to claim 1, wherein:
    the at least one second RF performance area of the PCB comprises a plurality of separate areas;
    the first RF performance area of the PCB comprises a plurality of separate areas; and
    at least one of the first RF performance areas surrounds at least one of the second RF performance areas.

4. The method according to claim 1, wherein signal performance in the at least one second RF performance area of the PCB is greater than signal performance in the at least one first RF performance area of the PCB.

5. The method according to claim 1, wherein the etching process comprises at least one of an etchant and an oxide treatment process.

6. The method according to claim 1, wherein the etching process comprises laser texturing.

7. The method according to claim 1, wherein the method further comprises, prior to etching the surface of the copper foil by the etching process, releasably bonding an opposing surface of the copper foil to a copper carrier using a release layer.

8. The method according to claim 1, wherein the surface of the copper foil is adhesively bonded to the substrate.

9. A method for selectively etching a surface of a copper foil configured to be bonded to a substrate of a printed circuit board (PCB), the method comprising:
    providing a copper foil having a surface;
    providing a configuration for a PCB having at least one first area corresponding to a first radio-frequency (RF) performance, and at least one second area corresponding to a second RF performance different from the first RF performance, wherein signal performance of the second RF performance is greater than signal performance of the first RF performance;
    mapping, on the surface of the copper foil, the at least one area corresponding to the first RF performance; and
    etching, by an etching process, the mapped surface of the copper foil corresponding to the first RF performance.

10. The method according to claim 9, wherein the surface of the copper foil corresponding to the at least one second RF performance is not etched by the etching process.

11. The method according to claim 10, wherein, after the etching process is complete, surface roughness of the surface of the copper foil is greater in the at least one area corresponding to the first RF performance than in the at least one area corresponding to the second RF performance.

12. The method according to claim 9, wherein the etching process comprises at least one of an etchant and an oxide treatment process.

13. The method according to claim 9, wherein the etching process comprises laser texturing.

14. The method according to claim 9, wherein the method further comprises, prior to etching the surface of the copper foil by the etching process, releasably bonding an opposing surface of the copper foil to a copper carrier using a release layer.

15. The method according to claim 9, wherein the at least one area corresponding to the first RF performance substantially surrounds the at least one area corresponding to the second RF performance.

* * * * *